United States Patent
Ghosh (10) Patent No.: US 7,210,227 B2
(45) Date of Patent: *May 1, 2007

(54) DECREASING THERMAL CONTACT RESISTANCE AT A MATERIAL INTERFACE

(75) Inventor: Prosenjit Ghosh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/306,108

(22) Filed: Nov. 26, 2002

(65) Prior Publication Data

US 2004/0099410 A1    May 27, 2004

(51) Int. Cl.
    *H05K 7/20* (2006.01)
(52) U.S. Cl. .................... 29/890.03; 165/185; 361/704
(58) Field of Classification Search .................. None
    See application file for complete search history.

(56) References Cited

U.S. PATENT DOCUMENTS

| | | | |
|---|---|---|---|
| 4,842,911 A | | 6/1989 | Fick |
| 5,403,783 A | * | 4/1995 | Nakanishi et al. .......... 438/106 |
| 5,698,471 A | * | 12/1997 | Namba et al. .............. 156/250 |
| 5,931,222 A | * | 8/1999 | Toy et al. .................. 165/80.3 |
| 5,981,085 A | | 11/1999 | Ninomiya et al. |
| 5,981,400 A | * | 11/1999 | Lo .............................. 438/745 |
| 6,130,113 A | | 10/2000 | Eslamy et al. |
| 6,273,787 B1 | * | 8/2001 | Gilmore et al. .............. 451/36 |
| 6,284,085 B1 | * | 9/2001 | Gwo ........................ 156/273.7 |
| 6,369,452 B1 | * | 4/2002 | Buchwalter et al. ........ 257/783 |
| 6,406,795 B1 | * | 6/2002 | Hwang et al. .............. 428/457 |
| 6,432,497 B2 | * | 8/2002 | Bunyan ...................... 428/40.1 |
| 6,433,055 B1 | * | 8/2002 | Kleyer et al. ............... 524/379 |
| 6,761,813 B2 | * | 7/2004 | Xu .............................. 205/114 |
| 2001/0026957 A1 | | 10/2001 | Atwood et al. |
| 2002/0132896 A1 | * | 9/2002 | Nguyen ....................... 524/404 |
| 2003/0066672 A1 | * | 4/2003 | Watchko et al. .............. 174/50 |
| 2003/0128521 A1 | * | 7/2003 | Matayabas et al. ......... 361/705 |
| 2003/0143382 A1 | * | 7/2003 | Xu .............................. 428/209 |
| 2003/0227959 A1 | * | 12/2003 | Balian et al. ............... 374/161 |
| 2004/0164383 A1 | | 8/2004 | Xu |
| 2006/0040112 A1 | * | 2/2006 | Dean et al. ................. 361/704 |

FOREIGN PATENT DOCUMENTS

EP          1 041 627 A2    10/2000
WO    PCT/US 03/34663      9/2004

OTHER PUBLICATIONS

Putnis, A., "Introduction to Mineral Sciences" Cambridge University Press, 1992, pp. 141-142.

* cited by examiner

*Primary Examiner*—Leonard R. Leo
(74) *Attorney, Agent, or Firm*—Blakely, Sokoloff, Taylor & Zafman LLP (57) ABSTRACT

A heat sink assembly in which the interface material is chemically bonded to both the heat source material and the heat sink material. The chemical bonding can lower the contact resistance that would otherwise exist using conventional adhesives to attach the heat sink to the heat source. The chemical bonding achieved between the respective materials can be, for example, ionic, covalent or metallic bonds, depending on the characteristic of the materials used to make the heat source, the interface material, and the heat sink.

9 Claims, 6 Drawing Sheets

DECREASING THERMAL CONTACT RESISTANCE AT A MATERIAL INTERFACE

FIELD OF THE INVENTION

Embodiments of the invention relate generally to the field of thermal contact resistance and more specifically to creating chemical bonds between the mating parts of a heat sink.

BACKGROUND INFORMATION

Solid materials, such as copper or aluminum, generally conduct heat more efficiently than do gases such as air. The thermal conductivity of a material describes the materials ability to conduct heat. Pure copper has a thermal conductivity of 386 Watts/meter degree centigrade (W/m° C.) at zero degrees centigrade. Air has a thermal conductivity of 0.024 W/m° C. When two solid pieces of material are mated together by means of mechanical bonding, entrapped voids exist at the mating surface, which require heat to flow through a combination of smoothly contacting parts of the surface and across the entrapped voids. In the region of the voids, the heat transfer is affected by the thermal conductivity of the entrapped gas, or lack thereof, depending on the particular design of the mating surface. In the region of the contacting surfaces the heat transfer is governed more closely by the thermal conductivity of the solid materials.

Figure 1:
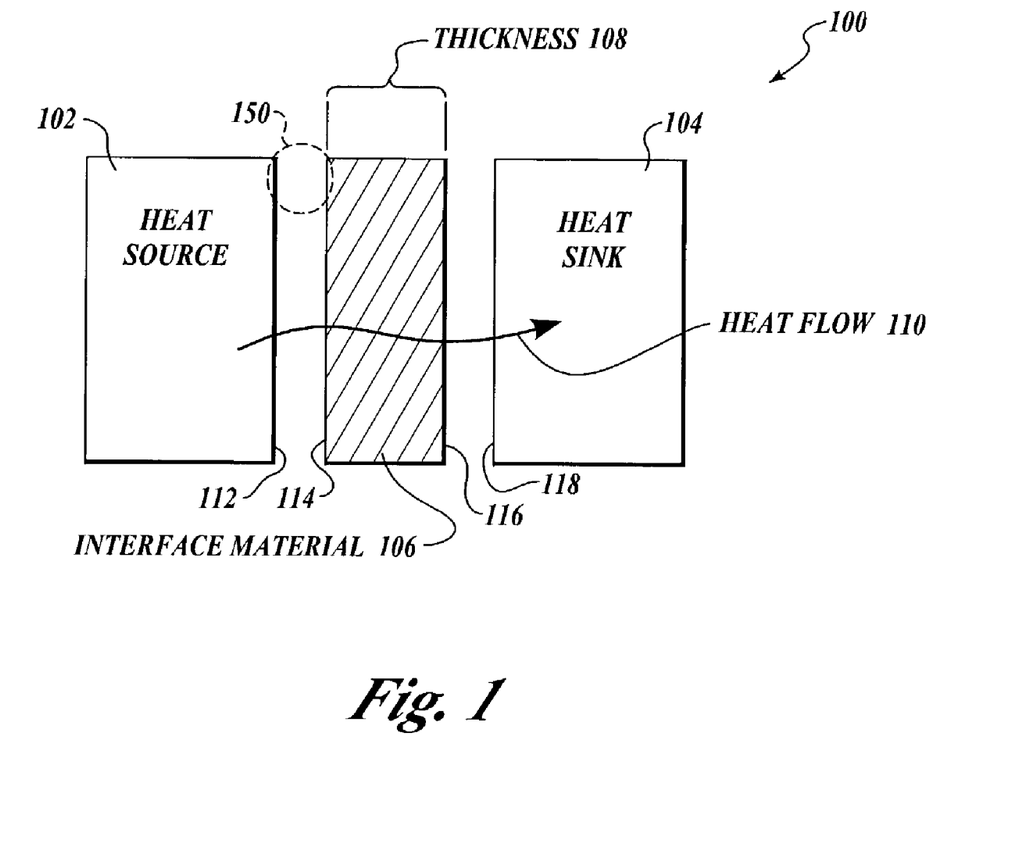
FIG. 1 is a diagram illustrating a typical conventional heat source/sink assembly.

FIG. 1 illustrates, at 100, an existing heat source/sink assembly where three materials are joined together. With reference to FIG. 1, a heat source 102 is mated with an interface material 106. The interface material 106 is mated to a heat sink 104 by means of mechanical bonding. The mechanical bonding results in entrapped voids and a resulting gap as indicated by 150. A heat flow 110 is in the direction from the heat source 102 to the heat sink 104 along a temperature gradient where a temperature profile decreases in the direction of the arrow. The interface material 106 has a thickness 108. The thermal resistance of a material is inversely proportional to the thermal conductivity. A material with a high conduction coefficient, such as copper described above has a low thermal resistance. A gas, such as air described above has a high thermal resistance. At the interface of two materials joined together by mechanical bonding, thermal contact resistance exists.

Figure 2:
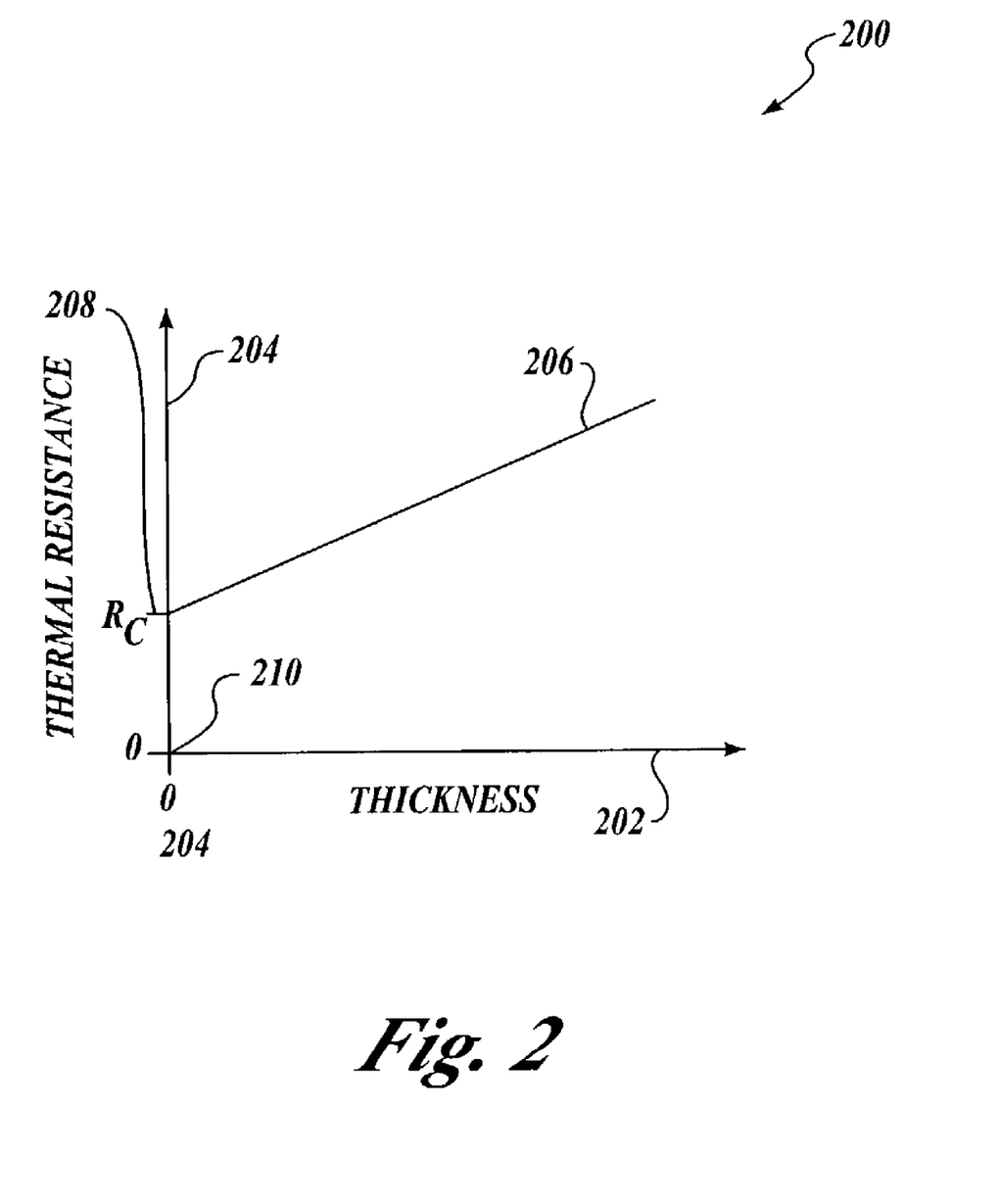
FIG. 2 is a graph illustrating thermal resistance as a function of interface material thickness.

FIG. 2 is a plot 200 of thermal resistance 204 verses interface material thickness 202. A linear variation of thermal resistance 206 with material thickness 202 indicates a non-zero thermal resistance $R_c$ 208 when the material thickness is zero at 210 (contact resistance). Existing heat transfer assemblies, such as the one shown in FIG. 1, exhibit the contact resistance shown in FIG. 2 at 208 and 210. Contact resistance has the undesirable effect of reducing the amount of heat transferred from the heat source 102 to the heat sink 104 in FIG. 1.

Figure 3:
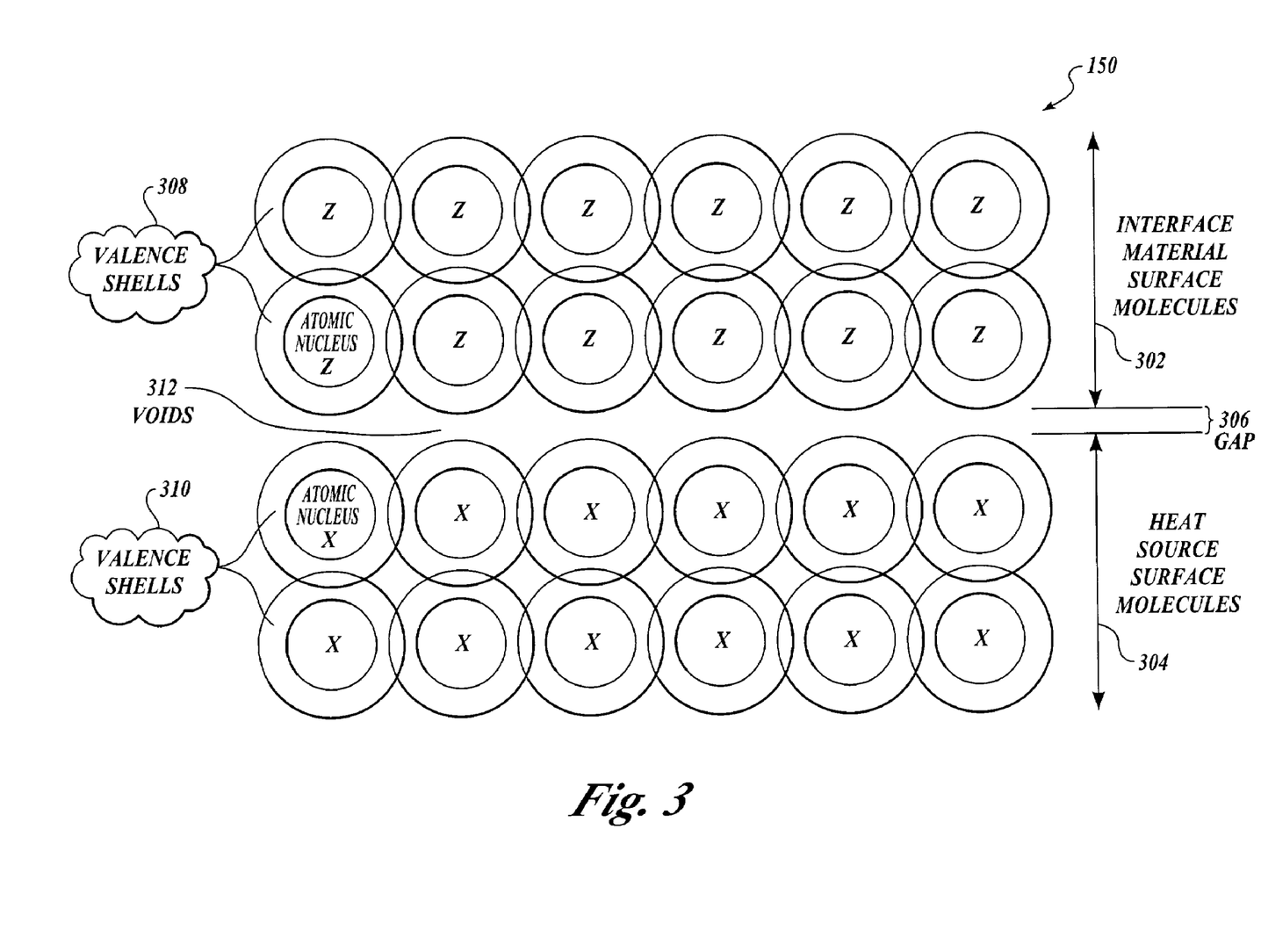
FIG. 3 is a diagram illustrating an atomic level view of the heat source/surface material interface depicted in FIG. 1.

At a molecular level, the contacting surfaces are actually very far apart due to the mechanical bonding. FIG. 3 illustrates, at 150, an atomic level view of an existing heat source/surface material interface. A distribution of heat source surface molecules is shown at 304. Heat source surface molecules 304 are representative of the atomic scale existing on the surface 112 from FIG. 1. A distribution of interface surface molecules is shown at 302. The interface surface molecules 302 are representative of those molecules existing on the surface 114 in FIG. 1.

Valence shells 310, of the heat source surface molecules 304, are shown as concentric circles with their respective atomic nuclei. Similarly, valence shells 308, of the interface surface molecules 302, are shown as concentric circles with their respective atomic nuclei. In between the heat source surface and the interface material surface are voids 312 defined by a gap 306. The gap 306 prevents the valence shells 308 from contacting the valence shells 310. The transfer of heat is impeded by the gap 308 and the voids 312 since the thermally excited heat source surface molecules 304 are not in molecular contact with the interface material-surface molecules 302. The thermal contact resistance results from the voids and resulting gap between the materials.

Existing heat transfer assemblies rely on mechanical bonds at the mating surfaces of adjacent material. Referring again to FIG. 1, typically, the interface material 106 is softer than either the heat source 102 or the heat sink 104. Mechanical bonding is achieved when the softer interface material 106 is pressed into the irregularities in the surface 112 of the heat source 102 and the surface 118 of the heat sink 104. Over time, and through use, the mechanical bonds can weaken and break. The already high thermal resistance 206 (FIG. 2) between the components 102, 106, and 104 of the hest transfer assembly 100 increases. This increase in thermal resistance results in a higher operating temperature for heat source 102. Adverse effects on an attached electronic device (not shown) are realized and the life expectancy of the associated system is jeopardized.

BRIEF DESCRIPTION OF THE DRAWINGS

The invention may best be understood by referring to the following description and accompanying drawings that are used to illustrate embodiments of the invention. The invention is illustrated by way of example and is not limited in the figures of the accompanying drawings, in which like references indicate similar elements.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Within a heat sink assembly according to embodiments of the present invention, the interface material is chemically bonded to both the heat source material and the heat sink material, thereby lowering the contact resistance formerly existing there between. The chemical bonding achieved between the respective materials can be, for example, ionic, covalent or metallic bonds, depending on the characteristic of the materials used to make the heat source, the interface material, and the heat sink. In other embodiments, other types of bonds may be used such as, for example, polar, non-polar, hydrogen bonds, dipole-dipole, ion-dipole, and van der Waals bonds. In some embodiments, more than one type of bond may be formed in an interface (e.g., the interface between the interface material and the heat sink or between the interface material and the heat source).

In embodiments in which a metal and a non-metal are used for the interface material and one of the adjacent layers (i.e., either the heat source or the heat sink), an ionic bond can be formed between the interface material and the adjacent layer.

In embodiments in which a non-metal is used for both the interface material and an adjacent layer, a covalent bond can be formed between the interface material and the adjacent layer.

In embodiments in which a metal is used for both the interface material and an adjacent layer, a metallic bond can be formed between the metals.

Forming chemical bonds between adjacent layers promotes heat transfer between adjacent layers by enhancing the mechanisms of heat transfer previously described. More particularly, chemical bonds enhances heat transfer via vibrational energy of an atom around its normal position (lattice vibration) and energy transferred by the free flow of electrons (when a material is used that has electrons available that can flow freely from atom to atom such as copper).

Although a heat transfer application is described above, in other embodiments, chemical bonding as described above is used to form reliable attachments or adhesion between structures. For example, a semiconductor die may be fixedly attached to a wiring substrate (e.g., made from semiconductor, ceramic, polymer, etc.). Such applications need not require high heat transfer characteristics.

The chemical bonds (especially ionic, covalent and metallic bonds) can form much stronger "adhesion" between materials. In addition, the bonds can be much more reliable in harsh environmental conditions. For example, in high temperature applications, adhesives may soften, expand or otherwise decrease in "adhesion performance". In low temperatures, adhesives may shrink, become brittle, or otherwise decrease in adhesion performance. Further, adhesives may weaken under temperature cycling. In contrast, chemical bonds as described above typically will not be degraded (provided the temperature does not increase so much as to break the bonds—which is unlikely in typical operating conditions for most applications).

Figure 4:
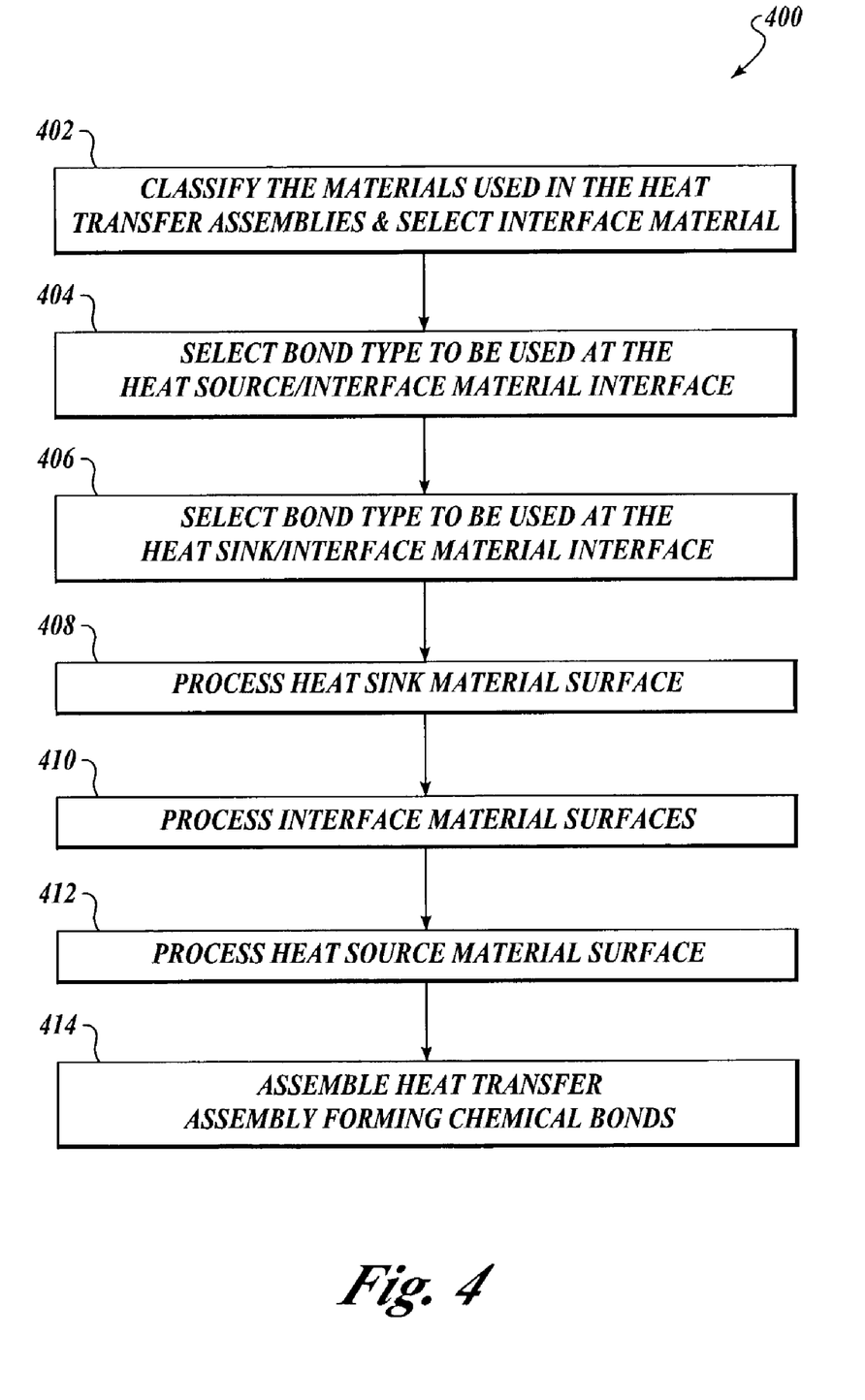
FIG. 4 is a flow chart illustrating a method directed to forming a chemical bond at the surface/surface contact within a heat sink, according to one embodiment of the present invention.

FIG. 4 is a flow chart illustrating a method 400 for forming a chemical bond at the interface between contacting surfaces within a heat sink. This method may also be used in attach structures to each other than heat sinks and heat sources, such as in applications that require relatively high adhesion performance.

In an initial operation, the materials used within the heat transfer assembly are classified. For example, the heat source material and the heat sink material are classified as metals or non-metals. An interface material is selected or a range of interface materials is selected. This operation is represented by a block 402 in FIG. 4.

Based on the materials used for the heat source/interface material interface, a compatible chemical bond (e.g., covalent, ionic or metallic) is selected for the interface between the heat source and the interface material. For example, the chemical bond should be compatible with the heat sink assembly materials and the permissible process conditions that the assembly can be exposed to. This operation is represented by a block 404 in FIG. 4.

Similarly, a compatible chemical bond (e.g., covalent, ionic or metallic) is selected for the interface between the heat sink and the interface material. For example, the chemical bond should be compatible with the heat sink assembly materials and the permissible process conditions that the assembly can be exposed to. This operation is represented by a block 406 in FIG. 4.

The heat sink material surface is processed according to the type of bond intended for the interface. This operation is represented by a block 408 in FIG. 4. Similarly, the interface material is processed consistent with the chemical bonds that are intended for each side of the interface material. For example, the heat sink surface may be etched or cleaned to remove impurities and/or oxidation. In some embodiments, the same type of bond is used on both sides of the interface material. In other embodiments, the bond used on one side of the interface material is different from the bond used on the other side of the interface material. This operation is represented by a block 410 in FIG. 4.

The heat source material surface is processed consistent with the intended bond for its interface with the interface material. For example, the heat sink surface may be etched or cleaned to remove impurities and/or oxidation. This operation is represented by a block 412 in FIG. 4.

The respective parts of the heat transfer assembly are assembled under suitable process conditions to create the selected chemical bonds between the respective layers (i.e., the heat source, interface material, and heat sink). For example, the process conditions may include a solution of selected pH introduced at the interface and increased temperature. This operation is represented by a block 414 in FIG. 4. The chemical bonds between the layers provide a structure that can advantageously increase thermal conductivity compared to conventional heat sink assemblies that use mechanical bonding (e.g., by substantially eliminating contact resistance and enhancing vibrational energy transfer and/or energy transfer by free flow of electrons).

Figure 5:
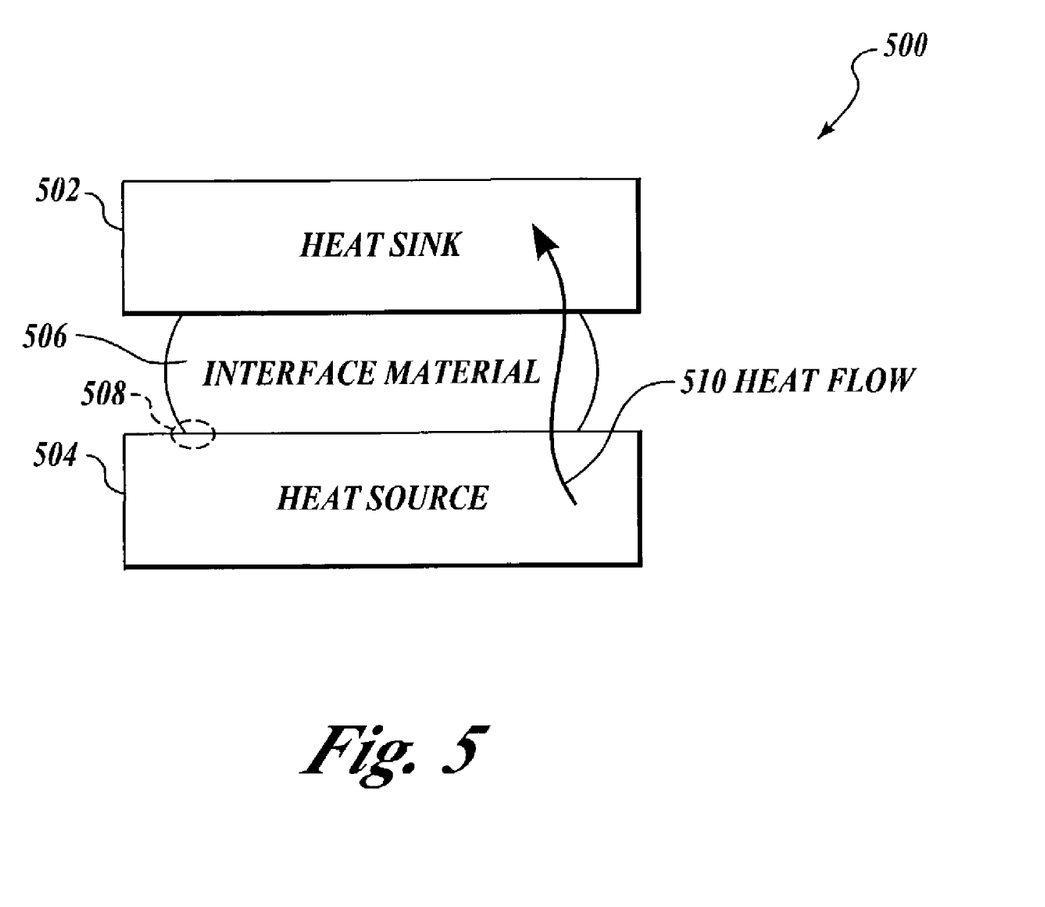
FIG. 5 is a diagram illustrating a heat source/sink assembly with chemical bonding between materials, according to one embodiment of the present invention.

FIG. 5 illustrates a heat source/sink assembly 500 with chemical bonding between materials. Referring to FIG. 5, a heat source 504 is chemically bonded to an interface material 506. The interface material 506 is chemically bonded to the heat sink material 502. A heat flow 510 occurs as indicated from the heat source 504 to the heat sink 502. The structure of the interface, at the atomic level, after the chemical bonding of the present invention in a sample region defined by 508 (FIG. 5) is shown in an exploded view in FIG. 6.

Figure 6:
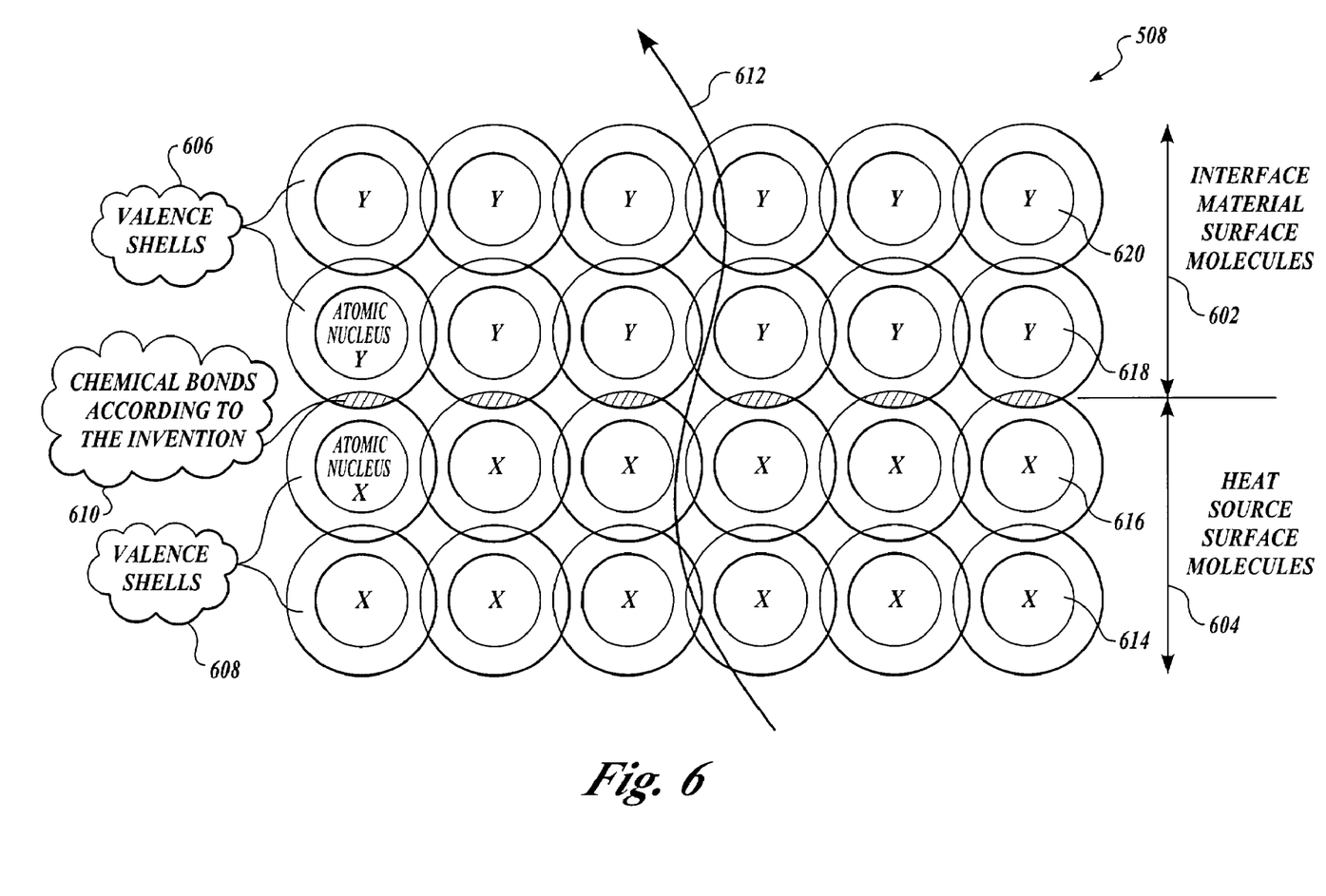
FIG. 6 is a diagram illustrating an atomic level view of chemical bonding at the heat source/surface material interface depicted in FIG. 5.

FIG. 6 illustrates an atomic level view, 508, of chemical bonding at the heat source/surface material interface. Referring to FIG. 6, an interface between adjacent layers is shown where heat source surface molecules 604 are chemically bonded to interface material surface molecules 602 according to one of several embodiments of the invention. The gap 306 formerly existing between surfaces (FIG. 3) has been eliminated by the present invention, thereby enhancing heat transfer between the heat source and the interface material.

More particularly, in this embodiment, chemical bonds 610 exist between the valence shells 608 of atoms that make up the heat source surface molecules 604 and the valence shells 606 of atoms that make up the interface surface molecules 602. The chemical bonding achieved at 610 can be ionic, covalent, or metallic. The present invention is not limited by which bond exists between two adjacent layers. A heat flow is in the direction indicated by an arrow 612 along a temperature gradient where a temperature profile decreases in the direction of the arrow 612. It is seen from FIG. 6 that the present invention enhances the heat transfer at the interface between layers regardless of the mode of heat transfer existing between the layers. Both the lattice vibration and the free flow of electron heat transport mechanisms are enhanced by the chemical bonds made according to the teaching of the present invention.

Elimination of the gap between heat source surface molecules 604 and interface material surface molecules 602 enables the valence shells of the neighboring atoms to contact each other directly. An atom 614 vibrating about its normal position excites neighboring atom 616 due to the continuity of 616 in the atomic lattice. Similarly, interface material surface molecule 618 is excited as well as molecule 620 since the interface material surface has been incorporated into the atomic lattice due to the chemical bonding.

If the materials selected for the heat source surface 604 and the interface material surface 602 have a supply of free electrons, such as the state that exists in metals, then heat transfer is enhanced due to the sharing of electrons in the valence shells of the molecules at the interface of the layers, e.g. 616 and 618. The present invention overcomes the problem with the existing bond interface, shown in FIG. 3 at 150 and characterized by the gap 306, which prohibits the free flow of electrons from 304 to 302, thus hampering the flow of heat in existing heat transfer assemblies For heat sink applications, typical heat source materials include semiconductor materials such as silicon and germanium, including oxides and nitrides (and other compounds) of the semiconductor materials. Typical heat sink materials include metals such as aluminum and copper, and carbon materials such as carbon fiber, silicon carbide, and graphite. In accordance with the embodiments of the invention, the interface material is a compound material that includes one material to serve as a binder or matrix material and another material(s) to serve as a filler material. In some embodiments, the binder material is a polymer material such as silicone. In other embodiments, other suitable materials can be used. Depending on the materials of the heat source and the heat sink, the filler material can include boron, indium, silver, copper, and/or carbon (this list is not intended to be exhaustive). In these embodiments, one or more components of the filler material can form chemical bonds with the materials of the heat source and the heat sink. The reactions to form the chemical bonds can be induced in some embodiments by placing the heat sink, interface material and heat source in contact as shown in FIG. 5 and then heating the structure. In addition, a base solution (e.g., aqueous sodium hydroxide) can be introduced into the interfaces between the materials. Channels or holes may be formed in one or more of the materials to allow gases (which can be created when the chemical bonds are formed) to escape from the interfaces.

It will be appreciated that the methods described in conjunction with the figures may be embodied in machine-executable instructions, e.g. software. The instructions can be used to cause a general-purpose or special-purpose processor that is programmed with the instructions to perform the operations described. Alternatively, the operations might be performed by specific hardware components that contain hardwired logic for performing the operations, or by any combination of programmed computer components and custom hardware components. The methods may be provided as a computer program product that may include a machine-readable medium having stored thereon instructions, which may be used to program a computer (or other electronic devices) to perform the methods. For the purposes of this specification, the terms "machine-readable medium" shall be taken to include any medium that is capable of storing or encoding a sequence of instructions for execution by the machine and that cause the machine to perform any one of the methodologies of the present invention. The term "machine-readable medium" shall accordingly be taken to included, but not be limited to, solid-state memories, optical and magnetic disks, and carrier wave signals. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result.

While the invention has been described in terms of several embodiments, those of ordinary skill in the art will recognize that the invention is not limited to the embodiments described, but can also be practiced with modification and alteration within the spirit and scope of the appended claims. The description is thus to be regarded as illustrative instead of limiting. Accordingly, all such variations and modifications are included within the intended scope of the invention as defined by the following claims.

What is claimed is:

1. A method comprising:
   preparing a surface of a heat source for ionic bonding;
   preparing a surface of a heat sink for ionic bonding;
   attaching the surface of the heat source to a first surface of an interface material, the interface material comprising a binder material and a filler material; and
   attaching the surface of the heat sink to a second surface of the interface material, wherein ionic bonds are formed between components of the heat source and the interface material and between components of the heat sink and the interface material.

2. The method of claim 1 wherein the binder material includes silicone and wherein the filler material includes at least one component selected from the group comprising boron, indium, silver, copper or carbon.

3. The method of claim 1 wherein the heat source is a semiconductor integrated circuit.

4. An apparatus comprising:
   a heat source having a first surface;
   a heat sink having a second surface;
   an interface material attached to the first and second surfaces, wherein ionic bonds are formed between components of the heat source and the interface material and between components of the heat sink and the interface material, and wherein the interface material comprises a binder material and a filler material.

5. The apparatus of claim 4 wherein the binder material includes silicone and wherein the filler material includes at least one component selected from the group comprising boron, indium, silver, copper or carbon.

6. The apparatus of claim 4 wherein the heat source is a semiconductor integrated circuit.

7. A method comprising:
   forming a first ionic bond between a first surface of an interface material and a surface of a heat source, the interface material comprising a binder material and a filler material; and forming a second ionic bond between a second surface of the interface material and a surface of a heat sink, wherein heat is transferred from the heat source to the heat sink.

8. The method of claim 7 wherein the binder material includes silicone and wherein the filler material includes at least one component selected from the group comprising boron, indium, silver, copper or carbon.

9. The method of claim 7 wherein the heat source is a semiconductor integrated circuit.

* * * * *